United States Patent
Houston

(10) Patent No.: US 7,307,907 B2
(45) Date of Patent: Dec. 11, 2007

(54) SRAM DEVICE AND A METHOD OF OPERATING THE SAME TO REDUCE LEAKAGE CURRENT DURING A SLEEP MODE

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/732,970

(22) Filed: Dec. 11, 2003

(65) Prior Publication Data

US 2005/0128789 A1  Jun. 16, 2005

(51) Int. Cl.
  *G11C 7/00* (2006.01)
  *G11C 11/00* (2006.01)
(52) U.S. Cl. .............. 365/222; 365/226; 365/227; 365/228; 365/229; 365/154; 365/156
(58) Field of Classification Search ........... 365/222, 365/226, 227, 229, 154, 156, 228
See application file for complete search history.

(56) References Cited

U.S. PATENT DOCUMENTS

| | | | | |
|---|---|---|---|---|
| 5,563,839 A | * | 10/1996 | Herdt et al. | 365/227 |
| 6,031,780 A | * | 2/2000 | Abe | 365/227 |
| 6,075,742 A | * | 6/2000 | Youssef et al. | 365/229 |
| 6,396,336 B2 | * | 5/2002 | Roberts et al. | 365/227 |
| 6,434,076 B1 | * | 8/2002 | Andersen et al. | 365/226 |
| 6,549,450 B1 | * | 4/2003 | Hsu et al. | 365/154 |
| 6,925,025 B2 | * | 8/2005 | Deng et al. | 365/226 |

OTHER PUBLICATIONS

Theodore W. Houston, et al. "Bit Line Control for Low Power in Standby" U.S. Appl. No. 10/337,069, filed Jan. 6, 2003, TI-34949.
Theodore W. Houston, et al. "SRAM with Temperature-Dependent Voltage Control in Sleep Mode" U.S. Appl. No. 10/745,429, filed Dec. 22, 2003, TI-36138.
Xiaowei Deng, et al., "A Low Leakage SRAM Scheme" U.S. Appl. No. 10/349,277, filed Jan. 22, 2003, TI-34973.

* cited by examiner

*Primary Examiner*—Trong Phan
(74) *Attorney, Agent, or Firm*—Rose Alyssa Keagy; W. James Brady, III; Frederick J. Telecky, Jr.

(57) ABSTRACT

An SRAM device and a method of operating an SRAM device. In one embodiment, the SRAM device includes (1) an SRAM array coupled to row peripheral circuitry by a word line and coupled to column peripheral circuitry by bit lines and (2) a sleep mode voltage controller configured to provide both an array high supply voltage $V_{ADD}$ that is lower than a high operating voltage $V_{DD}$ and an array low supply voltage $V_{ASS}$ that is higher than a low operating voltage $V_{SS}$ to the SRAM array during a sleep mode.

29 Claims, 3 Drawing Sheets

SRAM DEVICE AND A METHOD OF OPERATING THE SAME TO REDUCE LEAKAGE CURRENT DURING A SLEEP MODE

TECHNICAL FIELD OF THE INVENTION

The present invention is directed, in general, to memory devices and, more specifically, to a Static Random-Access Memory (SRAM) device and a method of operation that reduces leakage current during a sleep mode.

BACKGROUND OF THE INVENTION

Different types of memory are used in electronic apparatus for various purposes. Read only memory (ROM) and random-access memory (RAM) are two such types of memory commonly used within computers for different memory functions. ROM retains its stored data when power is switched off and therefore is often employed to store programs that are needed for powering-up an apparatus. ROM, however, does not accommodate writing. RAM, on the other hand, allows data to be written to or read from selected addresses associated with memory cells and, therefore, is typically used during normal operation of the apparatus.

Two common types of RAM are dynamic RAM (DRAM) and static RAM (SRAM). DRAM is typically used for the main memory of computers or other electronic apparatuses since, though it must be refreshed, it is typically inexpensive and requires less chip space than SRAM. Though more expensive and space-consumptive, SRAM does not require refresh, making it faster. These attributes make SRAM devices particularly desirable for portable equipment, such as laptop computers and personal digital assistants (PDAs).

A typical SRAM device includes a matrix of addressable memory cells arranged in columns and rows. A typical SRAM cell includes two access transistors and a flip-flop formed with two cross-coupled inverters, each inverter having a pull-down (driver) and a pull-up (load) transistor. The gates of the access transistors in each row are connected to a word line and the sources of each of the access transistors in each column are connected to either one of a bit line pair, B or $\overline{B}$. Peripheral circuitry associated with the rows (or word lines) and peripheral circuitry associated with the columns (or bit lines) facilitate reading data from, and writing data to, the SRAM cells.

Generally, to read data from a SRAM cell, a word line driver may activate a word line according to an address decoded by a row decoder and received via a signal path that typically includes an address bus connected to the SRAM device. The access transistors turn on and connect the outputs of the flip-flop to the bit line pair sending signals representing the data in the SRAM cell to a sense amplifier coupled to the bit line pair. The sense amplifier amplifies the potential difference on the bit line pair. Data from the sense amplifier is output to the external circuitry of the associated electronic apparatus optionally through a buffer. Essentially, data is written to each SRAM cell in the opposite way.

As mentioned above, to retain the data written to the matrix of SRAM cells, or memory array, each SRAM cell must have a continuous supply of power. SRAM devices, however, are often employed within battery-powered wireless apparatus where power consumption is an important design parameter. Accordingly, wireless apparatus may be transitioned from an active mode to a standby mode of lower power consumption. As transistor size continues to diminish (e.g., 90 nm transistors), current leakage may be unacceptably high even during standby mode, requiring a transition to a still lower power consumption level, sleep mode, or data retention mode, to conserve power adequately.

Even in sleep mode, however, current leakage is a concern. The current leakage may be a combination of subthreshold leakage current, gate leakage and diode leakage current from the SRAM cell transistors. The subthreshold leakage current may be directly related to a threshold voltage of the SRAM cell transistors. Typically, an increase in the threshold voltage reduces the subthreshold leakage current. The threshold voltage may be increased by increasing a well voltage, such as an n-well voltage $V_{nwell}$, of the SRAM cell transistors. The diode leakage current may be Gate Induced Diode Leakage (GIDL) or, similarly, Gate Edge Diode Leakage (GEDL), that is a function of a voltage from a source or drain of the transistor to a back gate of the transistor. For example, the back gate, sometimes referred to as the body of the transistor, may be a substrate of the transistor for an n-channel transistor and an n-well for a p-channel transistor. In some process variations, there may be a p-well as the back gate of the n-channel transistors. In other processes, the back gate may be a conductor separated from the channel region by a dielectric. The term back gate may cover any structure in which the voltage thereof can influence the threshold voltage of a primary gate. Typically, as voltage between the source or drain and the back gate increases, the diode leakage current also increases.

Presently, to reduce current leakage during sleep mode, voltage across the SRAM cell may be reduced as limited by static noise margin (SNM) requirements and by using back gate biases as limited by diode leakage current. For example, a high operating voltage $V_{DD}$ supplied to the SRAM device may be lowered to reduce voltage across the SRAM cells and the n-well voltage may be increased to raise the p-channel threshold voltage $V_{tp}$. Alternatively, a low operating voltage $V_{SS}$ supplied to the SRAM device may be increased to reduce the voltage across the SRAM cell and also provide back bias across n-channel transistors to raise n-channel threshold voltage $V_{tn}$. As mentioned, the increased back bias incurs an increase in the diode leakage current that reduces or negates the benefit of reduced subthreshold current. Thus, a tradeoff often occurs between increasing the voltage of the well that increases the threshold voltage and reduces the subthreshold leakage current, the $I_{off}$ current, that at the same time increases the diode leakage current.

Limiting a change in voltage to either lowering $V_{DD}$ or raising $V_{SS}$ simplifies the required circuitry and reduces the risk in voltage control. With continued miniaturization of future generation transistors, however, sufficiently lowering or raising $V_{DD}$ or $V_{SS}$, respectively, to significantly reduce gate current may result in an increase in diode current that becomes significant relative to savings in the gate current and the subthreshold current. As devices are further scaled, heavier doping is needed to control short channel effects. This heavier doping limits the subthreshold current increase with scaling but increases the diode leakage.

Accordingly, what is needed in the art is an improved low-power SRAM device that has minimum current leakage during sleep mode. More specifically, what is needed in the art is an improved SRAM device and method of operation that reduces total current leakage, including subthreshold, gate and diode currents, for new generation transistors.

SUMMARY OF THE INVENTION

To address the above-discussed deficiencies of the prior art, the present invention provides an SRAM device and a method of operating an SRAM device. In one embodiment, the SRAM device includes (1) an SRAM array coupled to row peripheral circuitry by a word line and coupled to column peripheral circuitry by bit lines and (2) a sleep mode voltage controller configured to provide both an array high supply voltage $V_{ADD}$ that is lower than a high operating voltage $V_{DD}$ and an array low supply voltage $V_{ASS}$ that is higher than a low operating voltage $V_{SS}$ to the SRAM array during a sleep mode.

In another embodiment, the present invention provides an SRAM device including (1) an SRAM array coupled to row peripheral circuitry by a word line and coupled to column peripheral circuitry by bit lines and (2) a sleep mode voltage controller configured to provide both an array high supply voltage $V_{ADD}$ and an array low supply voltage $V_{ASS}$ to the SRAM array during a sleep mode and modify the array high supply voltage $V_{ADD}$ and the array low supply voltage $V_{ASS}$ during transition from an active mode to the sleep mode.

The present invention allows optimization of the trade-off between reducing subthreshold current leakage and increasing diode gate leakage when a threshold voltage is increased with back bias for both n-channel and p-channel transistors. The present invention may substantially minimize total leakage current including gate, diode, and subthreshold currents by both raising a low operating voltage of the SRAM array relative to $V_{p\text{-}well}$ and lowering a high operating voltage of the SRAM array relative to $V_{n\text{-}well}$. As transistor miniaturization continues, the present invention may reduce concerns over diode and gate leakage by allowing heavier doping for a higher threshold voltage or improved control of short channel effects. Thus, the present advantageously allows the use of shorter gate lengths while maintaining about the same $I_{off}$. The present invention may allow optimization of the array high supply voltage $V_{ADD}$, the array low supply voltage $V_{ASS}$ and a well voltage as set values for a general technology class of transistors. Additionally, the present invention may allow further optimization of the SRAM array voltages through adjustments and refinements based on specific transistor characteristics.

In another aspect, the present invention provides a method of operating an SRAM device including (1) employing in an integrated circuit an SRAM array coupled to row peripheral circuitry by a word line and coupled to column peripheral circuitry by bit lines and (2) providing both an array high supply voltage $V_{ADD}$ that is lower than a high operating voltage $V_{DD}$ and an array low supply voltage $V_{ASS}$ that is higher than a low operating voltage $V_{SS}$ to the SRAM array during a sleep mode. Through this method of operating, current leakage during the sleep mode may be reduced.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
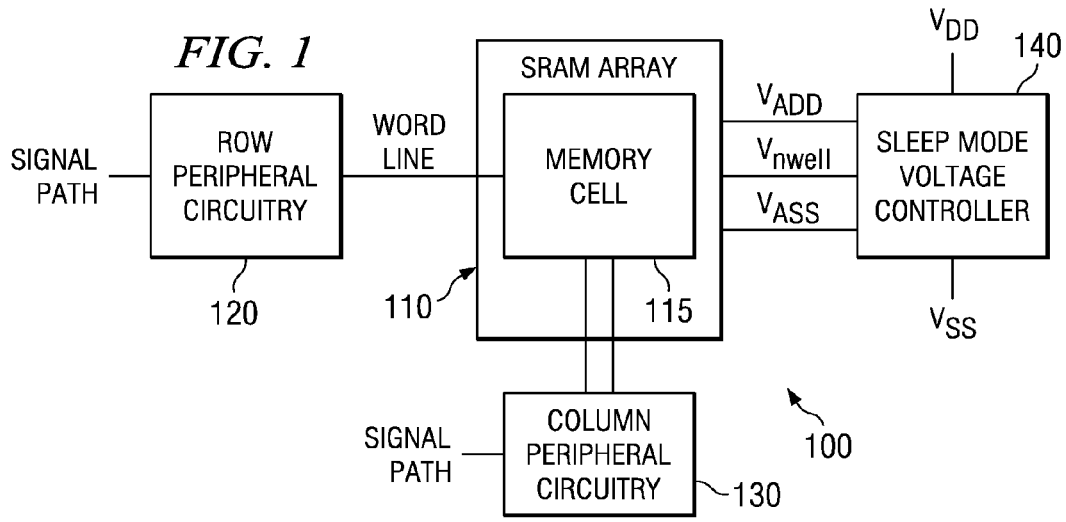
FIG. 1 illustrates a circuit diagram of an embodiment of an SRAM device constructed according to the principles of the present invention.

Referring initially to FIG. 1, illustrated is a circuit diagram of an embodiment of an SRAM device, generally designated 100, constructed according to the principles of the present invention. The SRAM device 100 includes an SRAM array 110, row peripheral circuitry 120, column peripheral circuitry 130 and a sleep mode voltage controller 140. Typically, the SRAM array 110 includes multiple memory cells organized in a matrix of columns and rows with corresponding multiple word lines and bit lines. For example, the SRAM array 110 may have 256 columns and 256 rows of memory cells. For ease of discussion, however, only a single memory cell 115 of the SRAM array 110 is illustrated. Accordingly, a single word line and bit line pair are illustrated and discussed along with the associated row and column peripheral circuitry 120, 130.

The SRAM device 100 may be a memory component for an associated microprocessor, digital signal processor (DSP), application-specific integrated circuit (ASIC) or larger electronic apparatus. In some embodiments, more than one SRAM device 100 may comprise the memory component. An Integrated Circuit (IC) associated with the SRAM device 100 may supply a high operating voltage $V_{DD}$ and a low operating voltage $V_{SS}$, thereto. The high operating voltage $V_{DD}$ and the low operating voltage $V_{SS}$ may be chip supply voltages. Typically, signal paths and a data interface of the associated apparatus may be coupled to the SRAM device 100 to send address information and retrieve/send data for reading/writing the data to the memory cell 115. One skilled in the art will understand coupling of the SRAM device 100 to the associated apparatus.

The memory cell 115 may have a unique address for writing and reading the data. MOSFETs and a flip-flop may be employed by the memory cell 115 to store the data as a one or a zero. Reading and writing of the data to the memory cell 115 may be controlled by the row peripheral circuitry 120 and the column peripheral circuitry 130.

The row peripheral circuitry 120 may control activating the word line of the SRAM array 110. The row peripheral circuitry 120 may include, for example, a row pre-decoder, a row decoder, a word line driver and a keeper. The word line driver may activate the word line for reading or writing based on an address signal received via a row signal path and decoded by the row pre-decoder and the row decoder.

The column peripheral circuitry 130 may control selecting the column of the SRAM array 110 for reading and writing. The column peripheral circuitry 130 may include, for example, pre-charge circuitry, write circuitry, a column multiplexer and a sense amplifier. Additionally, the column peripheral circuitry may include address decoders for determining memory cell locations within the SRAM array 110 and control circuitry for determining between writing or reading the data. The pre-charge circuitry, the write circuitry, the column multiplexer and the sense amplifier may facilitate reading and writing data to the correct column address that has been decoded. As with the row peripheral circuitry 120, the column peripheral circuitry 130 may also include additional components that facilitate writing and reading the data that are not illustrated or discussed herein.

The sleep mode voltage controller 140 may be configured to provide both an array high supply voltage $V_{ADD}$ and an array low supply voltage $V_{ASS}$ to the SRAM array 110 during a sleep mode and modify the array high supply voltage $V_{ADD}$ and the array low supply voltage $V_{ASS}$ during transition from an active mode to the sleep mode. The sleep mode voltage controller 140 may modify the array high supply voltage $V_{ADD}$ and the array low supply voltage $V_{ASS}$ based on reducing current leakage of the SRAM array 110 and providing sufficient voltage across the SRAM array 110 via the array high supply voltage $V_{ADD}$ and the array low supply voltage $V_{ASS}$ to retain data. In some embodiments, the sleep mode voltage controller 140 provides the array high supply voltage $V_{ADD}$ lower than $V_{n-well}$ during the sleep mode. This may be achieved by the sleep mode voltage controller 140 raising the $V_{n-well}$ to, for example, 1.8 volts. Thus, the array high supply voltage $V_{ADD}$ may be at a higher value than the high operating voltage $V_{DD}$, but at a lower value than $V_{n-well}$. The sleep mode voltage controller 140 may also provide the array low supply voltage $V_{ASS}$ higher than a substrate voltage during the sleep mode.

Additionally, the sleep mode voltage controller 140 may be configured to regulate the array high supply voltage $V_{ADD}$ relative to the array low supply voltage $V_{ASS}$ during the sleep mode. Alternatively, the sleep mode voltage controller 140 may be configured to regulate the array low supply voltage $V_{ASS}$ relative to the array high supply voltage $V_{ADD}$ during the sleep mode. The sleep mode voltage controller 140 may regulate the voltages to insure data retention while also minimizing leakage current. The sleep mode voltage controller 140 may regulate or modify the array high supply voltage $V_{ADD}$ and the array low supply voltage $V_{ASS}$ employing a low drop-out (LDO) regulator. Of course other components as discussed below with respect to the sleep mode voltage controller 140 may be employed to regulate the voltages.

In other embodiments, the sleep mode voltage controller 140 may be configured to provide both an array high supply voltage $V_{ADD}$ that is lower than the high operating voltage $V_{DD}$ and an array low supply voltage $V_{ASS}$ that is higher than the low operating voltage $V_{SS}$ to the SRAM array 110 during a sleep mode. Of course, in some embodiments an optimum bias of the SRAM array 110 may occur with the array high supply voltage $V_{ADD}$ higher than the high operating voltage $V_{DD}$. The array high supply voltage $V_{ADD}$ is considered "high" compared to the low operating voltage $V_{SS}$ instead of as a high value of a possible range of the high operating voltage $V_{DD}$.

The sleep mode voltage controller 140 may employ a fuse(s), a ROM, a transistor, a diode, a low-drop out regulator or a combination thereof to provide the sleep mode array voltages and allow adjustments or refinements of the voltages if desired. In some embodiments, the sleep mode voltage controller 140 may provide the array high supply voltage $V_{ADD}$ relative to an n-well voltage. Additionally, the sleep mode voltage controller 140 may provide the array low supply voltage $V_{ASS}$ relative to a p-well or substrate voltage. For example, the sleep mode voltage controller 140 may provide the array high supply voltage $V_{ADD}$ at a voltage value lower than a n-well voltage $V_{nwell}$ and the array low supply voltage $V_{ASS}$ higher than the substrate voltage (e.g., the low operating voltage $V_{SS}$). The relatively lower array high supply voltage $V_{ADD}$ may reduce a p-channel off current while increasing the p-channel diode leakage current. Additionally, the relatively higher array low supply voltage $V_{ASS}$ may reduce an n-channel off current while increasing an n-channel diode leakage current. A minimum total leakage current, however, may be obtained when both the array high supply voltage $V_{ADD}$ and the array low supply voltage $V_{ASS}$ are relatively lower than the well voltage and relatively higher than the substrate voltage, respectively.

The sleep mode voltage controller 140 may also provide an optimum well voltage during the sleep mode. The optimum well voltage may be determined in conjunction with the array high supply voltage $V_{ADD}$ and the array low supply voltage $V_{ASS}$ to provide a minimum leakage current during the sleep mode. Typically, the well voltage may be about the high operating voltage $V_{DD}$. The sleep mode voltage controller 140, therefore, may provide the array high supply voltage $V_{ADD}$ and the array low supply voltage $V_{ASS}$ at voltage values between the high operating voltage $V_{DD}$ and the low operating voltage $V_{SS}$ and provide a well voltage at about the high operating voltage $V_{DD}$. In some embodiments, the well voltage $V_{nwell}$ may be about 1.2 volts. The well voltage provided by the sleep mode voltage controller 140 may also vary based on transistor parameters.

The sleep mode voltage controller 140 may also provide the array high supply voltage $V_{ADD}$ and the array low supply voltage $V_{ASS}$ based on transistor parameters. In some embodiments, the sleep mode voltage controller 140 may provide the array high supply voltage $V_{ADD}$ and the array low supply voltage $V_{ASS}$ between the substrate voltage and the well voltage $V_{nwell}$ according to threshold voltages $V_{tn}$, $V_{tp}$, and diode gate leakage parameters.

Figure 4:
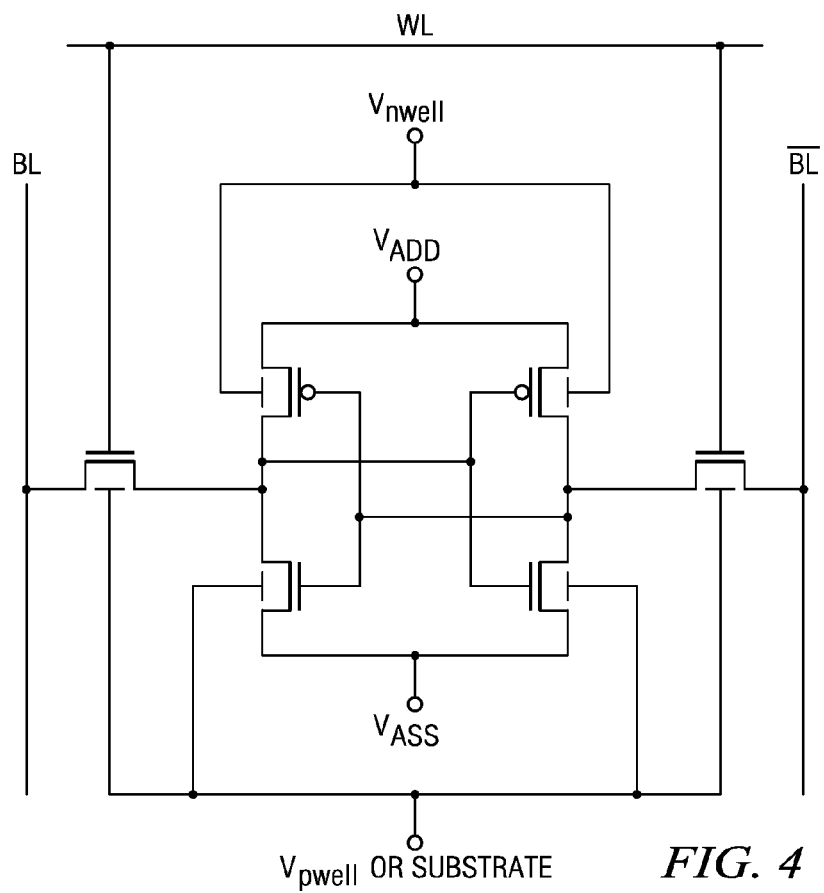
FIG. 4 illustrates a SRAM cell that is in accordance with the principles of the present invention.
Figure 5:
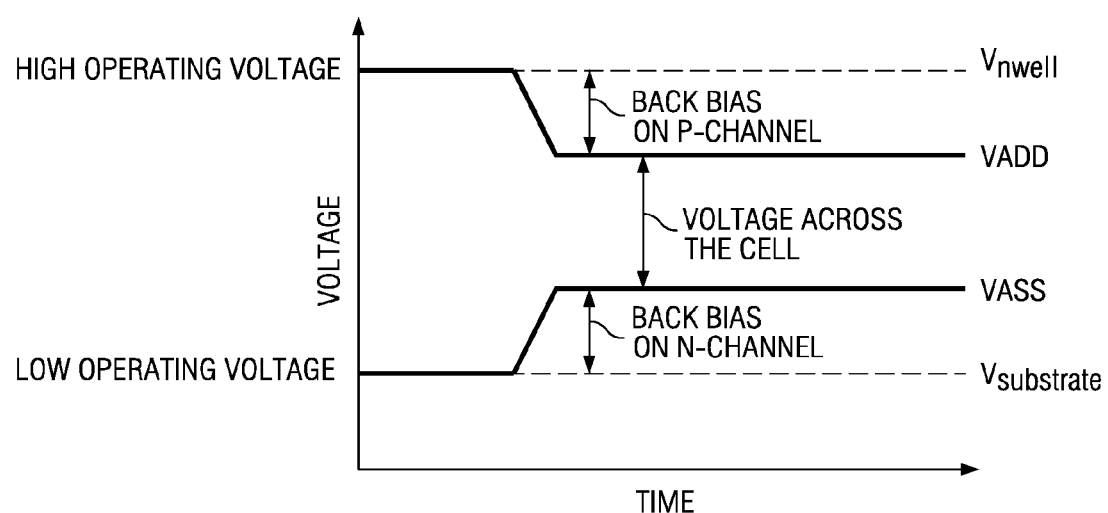
FIG. 5 is a timing diagram for an example operation of the SRAM cell of FIG. 4.

In some embodiments, the sleep mode voltage controller 140 may provide the array high supply voltage $V_{ADD}$, the array low supply voltage $V_{ASS}$ and the well voltage at optimum values for a set of transistor parameters. For example, the sleep mode voltage controller 140 may provide the array high supply voltage $V_{ADD}$ at about 0.8 volts, the array low supply voltage $V_{ASS}$ at about 0.4 volts and the n-well voltage $V_{nwell}$ at about 1.2 volts for a general technology class of transistors. Thus, the SRAM array may have about 0.4 volts back bias on both the n-channel and the p-channel in addition to about 0.4 volts across the SRAM cell, as shown in FIGS. 4 and 5. As shown in FIG. 5, this embodiment provides a well voltage such that an n-channel back bias voltage, a p-channel back bias voltage, and a voltage across the SRAM cell are about (but probably not exactly) the same.

Additionally, the sleep mode voltage controller 140 may provide an adjustable array high supply voltage $V_{ADD}$ and array low supply voltage $V_{ASS}$. Thus, the sleep mode voltage controller 140 may allow fine tuning of SRAM array 110 voltages for the sleep mode to obtain optimum values to reduce current leakage. The sleep mode voltage controller 140 may adjust the array high supply voltage $V_{ADD}$ and the array low supply voltage $V_{ASS}$ based on a process corner transistor parameter. For example, for a strong-n/weak-p corner, $V_{ADD}$ and $V_{ASS}$ may be made higher than for a weak-n/strong-p corner so as to apply more back bias to the n-channel transistors. Conversely, for a weak-n/strong-p corner, $V_{ADD}$ and $V_{ASS}$ may be made relatively lower to apply more back bias to the p-channel transistors. Similarly, a relatively higher $V_{ADD}$ and relatively lower $V_{ASS}$ may be applied for a weak-n/weak-p corner relative to a strong-n/strong-p corner to optimize the trade-off of diode current and subthreshold current.

Figure 2:
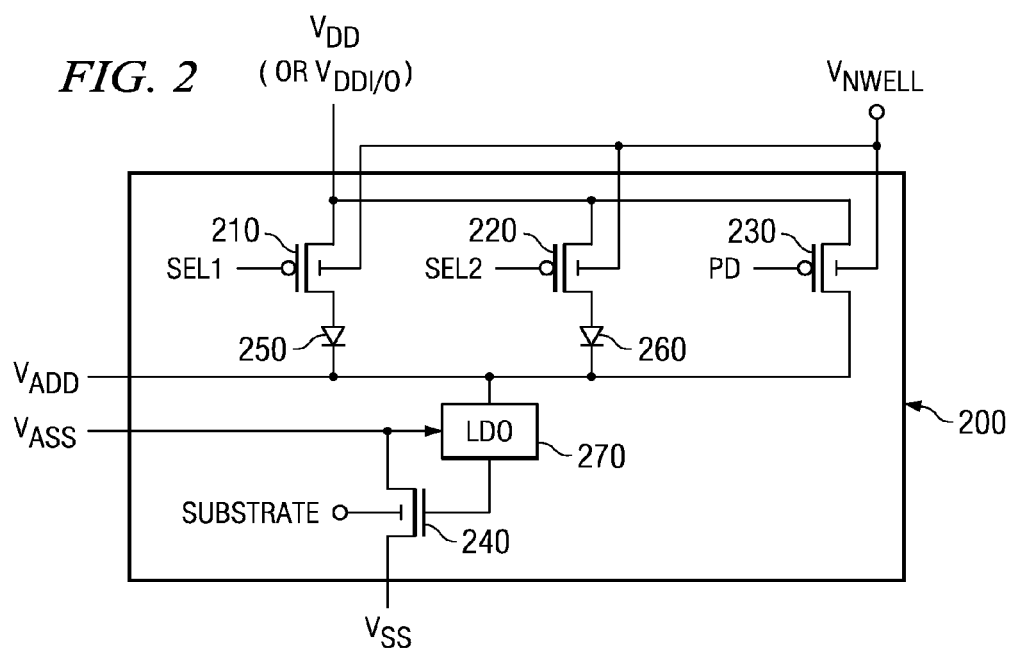
FIG. 2 illustrates a block diagram of an embodiment of a sleep mode voltage controller constructed according to the principles of the present invention.

Turning now to FIG. 2, illustrated is a block diagram of an embodiment of a sleep mode voltage controller, generally designated 200, constructed according to the principles of the present invention. The sleep mode voltage controller 200 includes a first, second, third and fourth switch, 210, 220, 230, 240, a first and second diode, 250, 260, and a low drop-out (LDO) regulator 270.

The first, second, and third switch 210, 220, 230, may be coupled between a supply of the high operating voltage $V_{DD}$ and the array high supply voltage $V_{ADD}$. The fourth switch 240 may be coupled between the array low supply voltage $V_{ASS}$ and a supply of the low operating voltage $V_{SS}$. Each one of the first, second, and third switch 210, 220, 230, may be a p-channel MOSFET and the fourth switch 240 may be n-channel MOSFET to facilitate pulling-up and pulling-down of associated voltages. The LDO regulator 270 may be connected to the array high supply voltage $V_{ADD}$, the array low supply voltage $V_{ASS}$ and switch 240. The LDO regulator 270 may also be connected to a reference voltage that is not shown for clarity.

The third switch 230 may be controlled by a power-down signal PD that indicates when a SRAM array is entering the sleep mode. When in an active mode or standby mode, the power-down signal PD may be low and the third switch 230 is turned-on such that the high operating voltage $V_{DD}$ is provided to the SRAM array. When entering the sleep mode, the power-down signal PD may go high and the third switch 230 is turned-off such that the high operating voltage $V_{DD}$ is not provided to the SRAM array.

The first and second switches, 210, 220, may be controlled by a first and a second select signal SEL1, SEL2 that may be used to choose, adjust or refine the array high supply voltage $V_{ADD}$ provided to the SRAM array by the sleep mode voltage controller 200. For example, the first select signal SEL1 may go low to turn on the first switch 210 when the power-down signal goes high. With the first switch 210 turned-on, a voltage drop across the first diode 250 may lower the high operating voltage $V_{DD}$ and provide the array high supply voltage $V_{ADD}$ to the SRAM array. Additionally, the LDO 270 may regulate the array low supply voltage $V_{ASS}$ provided to the SRAM array relative to the array high supply voltage $V_{ADD}$. Thus, the sleep mode voltage controller 200 may allow tight control of voltage across a SRAM cell which may be critical to stability while in the sleep mode.

The second select signal SEL2 may be used to control the second switch 220 to adjust the array high supply voltage $V_{ADD}$ and the array low supply voltage $V_{ASS}$ based on parameters of the SRAM array transistors. Additional switches and diodes may also be included to allow additional adjustment or refinement of the array high supply voltage $V_{ADD}$ and the array low supply voltage $V_{ASS}$. One skilled in the art will also understand that the sleep mode voltage controller 200 may employ other components in addition to or instead of those illustrated to adjust and refine voltages provided to the SRAM array during the sleep mode.

The sleep mode voltage controller 200 may also be configured to provide a well voltage, such as an n-well voltage $V_{nwell}$, to the SRAM array during sleep mode. As illustrated, the sleep mode voltage controller 200 provides the high operating voltage $V_{DD}$ to the SRAM array for the n-well voltage during sleep mode. In other embodiments, the sleep mode voltage controller 200 may include additional switches or other controls to selectively provide a well voltage to the SRAM array based on transistor parameters. For example, n-well may be raised relative to the high operating voltage $V_{DD}$ for embodiments having strong corner p-channel transistors. Optionally, the first switch 210 and the second switch 220 may be connected to a voltage other than the high operating voltage $V_{DD}$. For example, the first switch 210 and the second switch 220 may be connected to the high input/output voltage $V_{DDI/O}$. Also, as shown, first diode 250 and second diode 260 may be used to provide a voltage drop from the high operating voltage $V_{DD}$ to the array high supply voltage $V_{ADD}$. Other circuit elements could be used such as transistors or resistors. Alternatively, a voltage regulator such as an LDO may be used to supply the array high supply voltage $V_{ADD}$. Similarly, various circuit elements, such as diodes, transistors, and resistors may be used to supply the array low supply voltage $V_{ASS}$.

Figure 3:
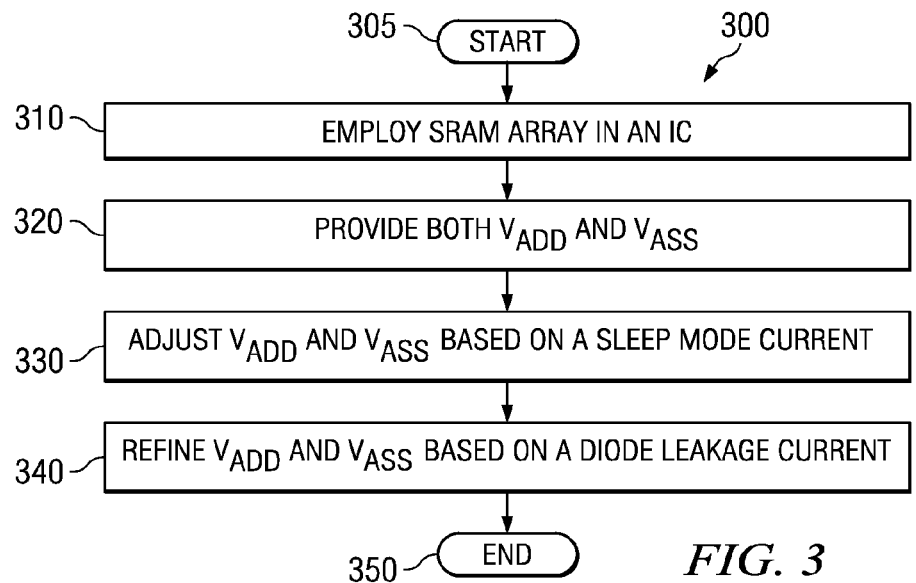
FIG. 3 illustrates an embodiment of a method of operating an SRAM device carried out according to the principles of the present invention.

Turning now to FIG. 3, illustrated is an embodiment of a method of operating an SRAM device, generally designated 300, carried out according to the principles of the present invention. The method begins in a step 305 with a desire to operate an SRAM device.

After beginning, an SRAM array is employed with an integrated circuit (IC) in a step 310. The SRAM array may be coupled to row peripheral circuitry and to column peripheral circuitry as part of the SRAM device. The IC may be an associated microprocessor, a digital signal processor (DSP), an application-specific integrated circuit (ASIC) or a larger electronic apparatus. The SRAM device may be a memory component for the IC.

After employing the SRAM array, both an array high supply voltage $V_{ADD}$ that is lower than a high operating voltage $V_{DD}$ and an array low supply voltage $V_{ASS}$ that is higher than a low operating voltage $V_{SS}$ are provided to the SRAM array during a sleep mode in a step 320. In one embodiment, the array high supply voltage $V_{ADD}$ and the array low supply voltage $V_{ASS}$ may be provided based on transistor parameters of the SRAM array. The array high supply voltage $V_{ADD}$ may be provided relative to a well voltage, such as, an n-well voltage. The array low supply voltage $V_{ASS}$ may be provided relative a substrate voltage.

Additionally, the well voltage may be provided to the SRAM array during the sleep mode. In some embodiments, the well voltage may be at about the high operating voltage $V_{DD}$. The well voltage, the array high supply voltage $V_{ADD}$ and the array low supply voltage $V_{ASS}$ may be provided as a set of optimum values for a general technology class of transistors. A sleep mode voltage controller may be employed to provide the SRAM array voltages (the array high supply voltage $V_{ADD}$, the array low supply voltage $V_{ASS}$ and the well voltage).

After providing both the array high supply voltage $V_{ADD}$ and the array low supply voltage $V_{ASS}$, the array high supply voltage $V_{ADD}$ and the array low supply voltage $V_{ASS}$ are adjusted based on a sleep mode current in a step 330. For example, if a n-channel $I_{off}$ is high, the array low supply voltage $V_{ASS}$ may be raised to provide more of a back gate bias on the n-channel. If a p-channel $I_{off}$ is high, the array high supply voltage $V_{ADD}$ may be lowered to provide more of a back gate bias on the p-channel. If both the n-channel $I_{off}$ and the p-channel $I_{off}$ are high, stability of a SRAM cell may tolerate a lesser amount of voltage across the SRAM cell.

After adjusting the array high supply voltage $V_{ADD}$ and the array low supply voltage $V_{ASS}$, the array high supply voltage $V_{ADD}$ and the array low supply voltage $V_{ASS}$ are refined based on a diode leakage current in a step 340. For example, if n-channel diode leakage current is high, the array low supply voltage $V_{ASS}$ may not be raised as much. Also, if the p-channel diode leakage current is high, the array high supply voltage $V_{ADD}$ may not be raised as much. Accordingly, the amount of back bias for the n-channel and the p-channel will not be as much. The sleep mode voltage controller may be employed to adjust and refine the SRAM array voltages for the sleep mode by employing fuses, transistors, diodes, a ROM, a LDO or a combination thereof. A test may be performed to determine a minimum voltage to maintain across the cell to retain data or to verify that the voltage across the cell is sufficient to retain data. The SRAM array voltages may be based on minimum cell voltage for data retention.

After refining, the method of operating the SRAM device ends in a step 350. Thus, the above method provides an embodiment to operate a SRAM device that reduces leakage current during sleep mode. While the methods disclosed herein have been described and shown with reference to particular steps performed in a particular order, it will be understood that these steps may be combined, subdivided or reordered to form an equivalent method without departing from the teachings of the present invention. Accordingly, unless specifically indicated herein, the order and/or the grouping of the steps are not limitations of the present invention. For example, the SRAM array voltages may be determined for a class of a process or design or may be done for individual instances. Furthermore, the SRAM array voltages may be determined at an initial characterization and test or may be done during operation.

Although the present invention has been described in detail, those skilled in the art should understand that they can make various changes, substitutions and alterations herein without departing from the spirit and scope of the invention in its broadest form.

What is claimed is:

1. An SRAM device, comprising:
    an SRAM array coupled to row peripheral circuitry by a word line and coupled to column peripheral circuitry by bit lines; and
    a sleep mode voltage controller configured to provide both an array high supply voltage $V_{ADD}$ that is lower than a high operating voltage $V_{DD}$ and an array low supply voltage $V_{ASS}$ that is higher than a low operating voltage $V_{SS}$ to said SRAM array during a sleep mode; wherein said array high supply voltage $V_{ADD}$ and said array low supply voltage $V_{ASS}$ are provided concurrently and wherein said sleep mode voltage controller provides said array high supply voltage $V_{ADD}$ and said array low supply voltage $V_{ASS}$ based on a transistor parameter of at least one transistor of the SRAM array.

2. The SRAM device as recited in claim 1 wherein said sleep mode voltage controller provides said array high supply voltage $V_{ADD}$ relative to a well voltage.

3. The SRAM device as recited in claim 1 wherein said sleep mode voltage controller provides said array low supply voltage $V_{ASS}$ relative to a substrate voltage.

4. The SRAM device as recited in claim 1 wherein said sleep mode voltage controller provides a well voltage at about said high operating voltage $V_{DD}$ during said sleep mode.

5. The SRAM device as recited in claim 1 wherein said sleep mode voltage controller adjusts said array high supply voltage $V_{ADD}$ and said array low supply voltage $V_{ASS}$ based on a transistor parameter.

6. The SRAM device as recited in claim 1 wherein said sleep mode voltage controller employs a component selected from the group consisting of:
    a transistor,
    a diode, and
    a low-drop out regulator.

7. The SRAM device as recited in claim 1 wherein said sleep mode voltage controller further provides a well voltage and said array high supply voltage $V_{ADD}$, said array low supply voltage $V_{ASS}$ and said well voltage are provided as a set of optimum values for a general technology class of transistors.

8. The SRAM device as recited in claim 1 wherein said sleep mode voltage controller adjusts said array high supply voltage $V_{ADD}$ and said array low supply voltage $V_{ASS}$ based on a sleep mode current.

9. The SRAM device as recited in claim 8 wherein said sleep mode voltage controller refines said array high supply voltage $V_{ADD}$ and said array low supply voltage $V_{ASS}$ based on a diode leakage current.

10. The SRAM device as recited in claim 1 wherein said sleep mode voltage controller further provides a well voltage such that an n-channel back bias voltage, a p-channel back bias voltage and a voltage across a SRAM cell are all about a same voltage.

11. The SRAM device as recited in claim 1 wherein said sleep mode voltage controller provides said array high supply voltage $V_{ADD}$ and said array low supply voltage $V_{ASS}$ based on a minimum voltage across said SRAM array that is sufficient for data retention.

12. The SRAM device as recited in claim 1 wherein said sleep mode voltage controller provides said array high supply voltage $V_{ADD}$ and said array low supply voltage $V_{ASS}$ based on a minimum voltage across said SRAM array that is sufficient for data retention and minimizing a total leakage current.

13. A method of operating an SRAM device, comprising:
    employing in an integrated circuit an SRAM array coupled to row peripheral circuitry by a word line and coupled to column peripheral circuitry by bit lines; and
    providing both an array high supply voltage $V_{ADD}$ that is lower than a high operating voltage $V_{DD}$ and an array low supply voltage $V_{ASS}$ that is higher than a low operating voltage $V_{SS}$ to said SRAM array during a sleep mode;
    wherein said array high supply voltage $V_{ADD}$ and said array low supply voltage $V_{ASS}$ are provided concurrently and wherein said providing said array high supply voltage $V_{ADD}$ and said array low supply voltage $V_{ASS}$ is based on a transistor parameter of at least one transistor of the SRAM array.

14. The method as recited in claim 13 wherein said providing said array high supply voltage $V_{ADD}$ is relative to a well voltage.

15. The method as recited in claim 13 further comprising providing a well voltage at about said high operating voltage $V_{DD}$ during said sleep mode.

16. The method as recited in claim 13 further comprising adjusting said array high supply voltage $V_{ADD}$ and said array low supply voltage $V_{ASS}$ based on a transistor parameter.

17. The method as recited in claim 13 wherein said providing employs a component selected from the group consisting of:
a transistor,
a diode, and
a low-drop out regulator.

18. The method as recited in claim 13 further comprising providing a well voltage wherein said array high supply voltage $V_{ADD}$, said array low supply voltage $V_{ASS}$ and said well voltage are provided as a set of optimum values for a general technology class of transistors.

19. The method as recited in claim 13 further comprising adjusting said array high supply voltage $V_{ADD}$ and said array low supply voltage $V_{ASS}$ based on a sleep mode current.

20. The method as recited in claim 19 further comprising refining said array high supply voltage $V_{ADD}$ and said array low supply voltage $V_{ASS}$ based on a diode leakage current.

21. The method as recited in claim 13 further comprising providing a well voltage such that an n-channel back bias voltage, a p-channel back bias voltage and a voltage across a SRAM cell are all about a same voltage.

22. An SRAM device, comprising:
an SRAM array coupled to row peripheral circuitry by a word line and coupled to column peripheral circuitry by bit lines; and
a sleep mode voltage controller configured to provide both an array high supply voltage $V_{ADD}$ and an array low supply voltage $V_{ASS}$ to said SRAM array during a sleep mode and modify said array high supply voltage $V_{ADD}$ and said array low supply voltage $V_{ASS}$ during transition from an active mode to said sleep mode;
wherein said array high supply voltage $V_{ADD}$ and said array low supply voltage $V_{ASS}$ are provided concurrently and wherein sleep mode voltage controller provides said array high supply voltage $V_{ADD}$ and said array low supply voltage $V_{ASS}$ are based on a transistor parameter of at least one transistor of the SRAM array.

23. The SRAM device as recited in claim 22 wherein said sleep mode voltage controller performs said modify based on reducing current leakage of said SRAM array and providing sufficient voltage across said SRAM array via said array high supply voltage $V_{ADD}$ and said array low supply voltage $V_{ASS}$ to retain data.

24. The SRAM device as recited in claim 22 wherein said sleep mode voltage controller provides said array high supply voltage $V_{ADD}$ lower than $V_{n\text{-}well}$ during said sleep mode.

25. The SRAM device as recited in claim 22 wherein said sleep mode voltage controller provides said array low supply voltage $V_{ASS}$ higher than a substrate voltage during said sleep mode.

26. The SRAM device as recited in claim 22 wherein said sleep mode voltage controller is configured to regulate said array high supply voltage $V_{ADD}$ relative to said array low supply voltage $V_{ASS}$ during said sleep mode.

27. The SRAM device as recited in claim 22 wherein said sleep mode voltage controller is configured to regulate said array low supply voltage $V_{ASS}$ relative to said array high supply voltage $V_{ADD}$ during said sleep mode.

28. An SRAM device, comprising:
an SRAM array coupled to row peripheral circuitry by a word line and coupled to column peripheral circuitry by bit lines; and
a sleep mode voltage controller configured to provide both an array high supply voltage $V_{ADD}$ that is lower than a high operating voltage $V_{DD}$ and an array low supply voltage $V_{ASS}$ that is higher than a low operating voltage $V_{SS}$ to said SRAM array during a sleep mode;
wherein said array high supply voltage $V_{ADD}$ and said array low supply voltage $V_{ASS}$ are provided concurrently.

29. The SRAM device as recited in claim 28 wherein said sleep mode voltage controller further provides a well voltage and said array high supply voltage $V_{ADD}$, said array low supply voltage $V_{ASS}$ and said well voltage are provided as a set of optimum values for a general technology class of transistors.

* * * * *